United States Patent [19]

Hattori et al.

[11] Patent Number: 5,424,586
[45] Date of Patent: Jun. 13, 1995

[54] MULTIPLEX COMMUNICATION CONTROL UNIT

[75] Inventors: Yukimitsu Hattori, Suzuka; Tetsuo Sugimoto, Osaka, both of Japan

[73] Assignees: Sumitomo Wiring Systems, Ltd., Mie Ken; Sumitomo Electric Industries, Ltd., Osaka, both of Japan

[21] Appl. No.: 302,021

[22] Filed: Sep. 9, 1994

Related U.S. Application Data

[63] Continuation of Ser. No. 822,093, Jan. 17, 1992, abandoned.

[30] Foreign Application Priority Data

Mar. 8, 1991 [JP] Japan .................. 3-068703

[51] Int. Cl.⁶ .................................. H05K 1/00
[52] U.S. Cl. ............................ 307/10.1; 361/749; 361/752; 361/828
[58] Field of Search .......... 361/749, 752, 828; 174/72 A, 72 TR, 268; 439/91, 77, 67; 307/10.1, 147–148

[56] References Cited

U.S. PATENT DOCUMENTS 4,831,278 5/1989 Ueda et al. .................. 307/10.1
5,204,806 4/1993 Sasaki et al. .................. 361/398

FOREIGN PATENT DOCUMENTS 281376 9/1988 European Pat. Off. .
367177 5/1990 European Pat. Off. .
3608027 9/1986 Germany .
61-80711 4/1986 Japan .
61-80712 4/1986 Japan .
61-271707 12/1986 Japan .

*Primary Examiner*—R. Skudy
*Assistant Examiner*—Adifya Krishnan
*Attorney, Agent, or Firm*—Sughrue, Mion, Zinn, Macpeak & Seas

[57] ABSTRACT

A multiplex communication control unit includes a multiplex communication control circuit and an electric circuit formed in the proximity of the multiplex communication control circuit. Both the multiplex communication control circuit and the electric circuit are formed on a flexible circuit board and are electrically connected with each other via the flexible circuit board.

4 Claims, 4 Drawing Sheets

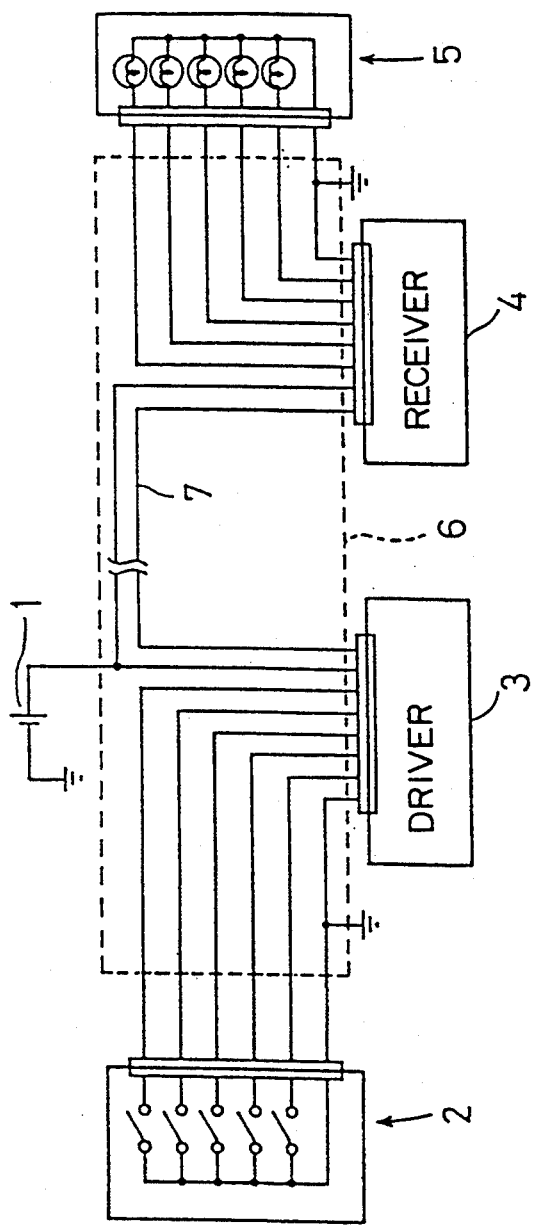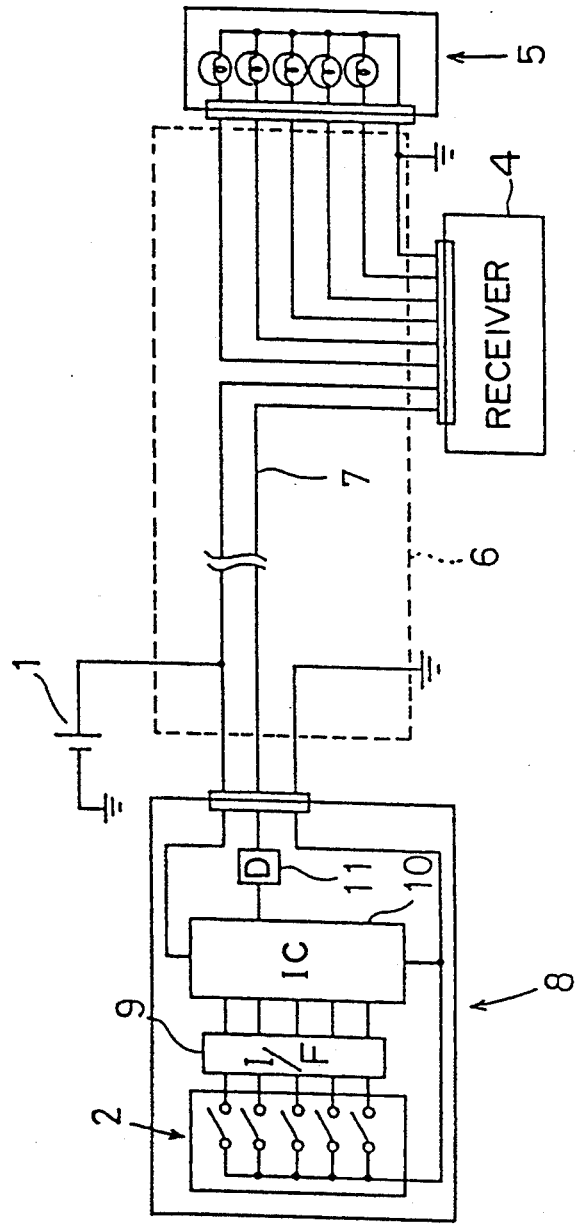
Fig. 6 PRIOR ART
Fig. 9 PRIOR ART

MULTIPLEX COMMUNICATION CONTROL UNIT

This is a Continuation of application Ser. No. 07/822,093, filed Jun. 17, 1992, now abandoned.

FIELD OF THE INVENTION

The present invention relates generally to a multiplex communication system, and more particularly to a multiplex communication control unit for use in an automotive vehicle.

DESCRIPTION OF THE PRIOR ART

FIG. 6 schematically depicts a conventional multiplex communication system provided in an automotive vehicle.

As shown in FIG. 6, a group of switches 2 and a group of lamps 5 are electrically connected with a multiplex driver unit 3 and a multiplex receiver unit 4, respectively, via a wire harness 6. Multiplex communication is conducted between the multiplex driver unit 3 and the multiplex receiver unit 4 via a multiplex signal transmission line 7. Both the multiplex driver unit 3 and the multiplex receiver unit 4 are supplied with electric power from a battery 1.

FIG. 7 is a circuit diagram of the multiplex driver unit 3. As shown in FIG. 7, the multiplex driver unit 3 comprises an input interface 21, a multiplex communication IC 22, and a communication driver 23, all of which are provided on a single printed circuit board and are electrically connected with an external circuit via a connector 27a.

FIG. 8 is a circuit diagram of the multiplex receiver unit 4. As shown in FIG. 8, the multiplex receiver unit 4 comprises a load driving circuit 24, a multiplex communication IC 25, and a communication receiver 26, all of which are provided on a single printed circuit board and are electrically connected with an external circuit via a connector 27b.

Because both the units 3 and 4 are internally provided with respective multiplex communication ICs 22 and 25, a wire harness is required to electrically connect the units 3 and 4 with the group of switches 2 and that of lamps 5, respectively.

In a multiplex communication system provided in an automotive vehicle, various attempts have hitherto been made to simplify wiring among loads i.e., a wire harness to reduce a wiring space required for the communication system.

The organization shown in FIG. 6 can simplify part of the wire harness for the multiplex communication. However, this kind of organization causes increase in the number of electric wires, as compared with the case in which no multiplex communication is conducted.

A multiplex communication system as shown in FIG. 9 provides a good solution for reduction of electric wires. This multiplex communication system includes a multiplex driver unit 8, in which are incorporated a group of switches 2 together with an input interface 9, a multiplex communication IC 10 and a communication driver 11.

When the multiplex driver unit 8 shown in FIG. 9 is mounted in a dashboard of an automotive vehicle, the group of switches 2 must be left uncovered on the surface of the dashboard for the operator's convenience whereas the multiplex driver unit 8 except the group of switches 2 must be placed inside the dashboard in the proximity of the group of switches 2. However, there is occasionally no room for placement of the multiplex driver unit 8 inside the dashboard.

Furthermore, if the group of switches 2 have only a small number of contacts, the number of multiplex driver units incorporating respective groups of switches therein is inevitably increased. The increase in the number of the multiplex driver units is followed by that in the number of multiplex communication ICs, Accordingly, the system of FIG. 9 is not so effective for its complicated organization.

SUMMARY OF THE INVENTION

The present invention has been developed to overcome the above-described disadvantages.

It is accordingly an object of the present invention to provide an improved multiplex communication control unit, which can be accommodated in a reduced space without complicating the organization of a multiplex communication system.

Another object of the present invention is to provide a multiplex communication control unit of the above-described type which is stable in functioning and can be readily manufactured at a low cost.

In accomplishing these and other objects, a multiplex communication control unit according to the present invention comprises a flexible circuit board, a multiplex communication control circuit formed on the flexible circuit board, and an electric circuit formed on the flexible circuit board in the proximity of the multiplex communication control circuit and electrically connected therewith via the flexible circuit board.

Conveniently, the multiplex communication control unit is incorporated in a multiplex communication system provided in an automotive vehicle.

BRIEF DESCRIPTION OF THE DRAWINGS

These and other objects and features of the present invention will become more apparent from the following description of a preferred embodiment thereof with reference to the accompanying drawings, throughout which like parts are designated by like reference numerals, and wherein:

FIG. 6 is a circuit diagram of a conventional multiplex communication system provided in an automotive vehicle;

FIG. 9 is a diagram similar to FIG. 6, depicting another conventional multiplex communication system.

DETAILED DESCRIPTION OF THE PREFERRED EMBODIMENTS

Figure 1:
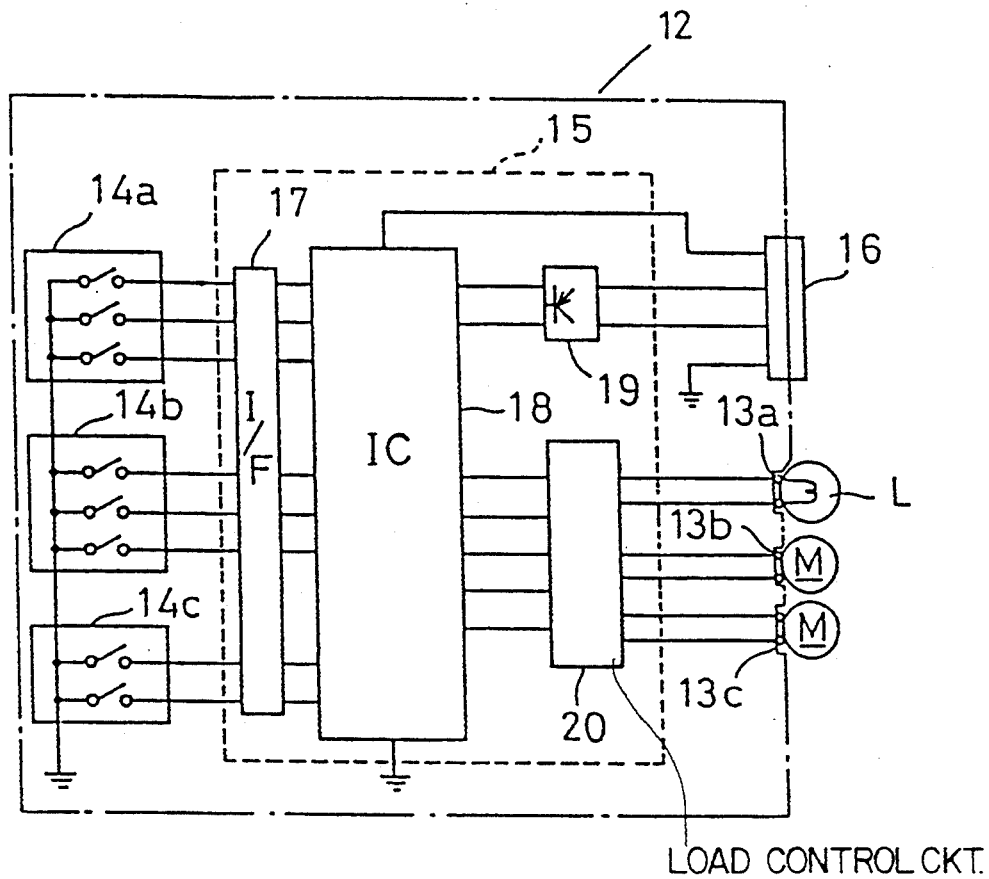
FIG. 1 is a circuit diagram of a multiplex communication control unit according to the present invention.

Referring now to the drawings, there is shown in FIG. 1 a circuit diagram of a multiplex communication control unit according to the present invention.

The multiplex communication control unit of FIG. 1 includes a multiplex communication control circuit 15, which comprises an input interface 17, a multiplex communication IC 18, a communication driver-receiver 19, and a load control circuit 20. The input interface 17, the communication driver-receiver 19, and the load control circuit 20 are electrically connected with the multiplex communication IC 18 in parallel with one another. The multiplex communication control circuit 15 together with plural groups of switches 14a, 14b and 14c is formed on a flexible printed circuit board (hereinafter referred to simply as FPC) 12. The groups of switches 14a, 14b and 14c are also mounted on the FPC 12 and electrically connected with the input interface 17 in the proximity of the multiplex communication control circuit 15. Furthermore, a plurality of load connectors 13a, 13b and 13c and an external communication line connector 16 are provided on the FPC 12, as well as the multiplex communication control circuit 15.

With the load connectors 13a, 13b and 13c are connected a plurality of loads such as, for example, lamps L and motors M. With the external communication line connector 16 are connected, for example, a plurality of flat cables (not shown) whereby the multiplex communication control circuit 15 is electrically connected with other multiplex communication control circuits (not shown).

Figure 2:
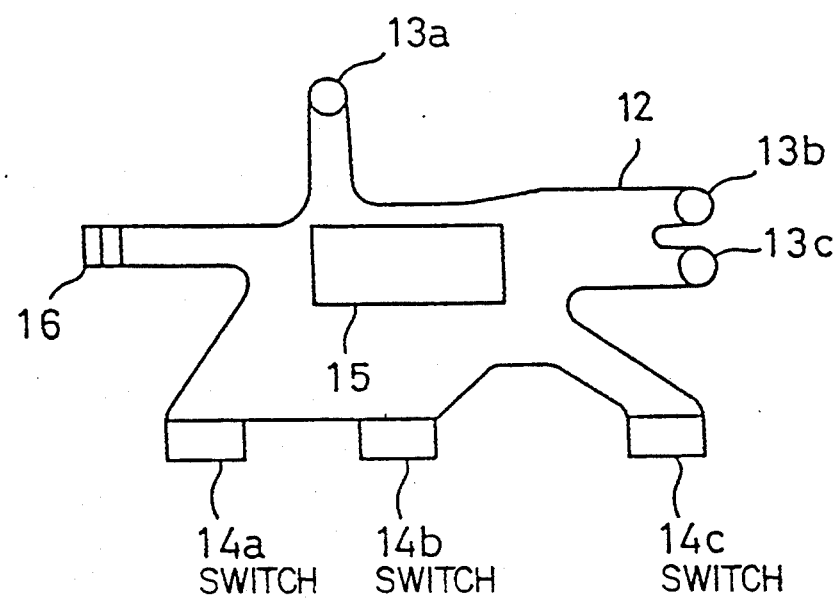
FIG. 2 is a top plan view of a flexible printed circuit board.

FIG. 2 schematically depicts an FPC 12 having a multiplex communication control circuit 15, a plurality of load connectors 13a, 13b and 13c and the like. The multiplex communication control circuit 15 is electrically connected with a wiring pattern (not shown) formed on the FPC 12 and with the load connectors 13a, 13b and 13c, a plurality of switches 14a, 14b and 14c, and an external communication line connector 16.

The provision of the multiplex communication control circuit 15 on the FPC 12 having the switches 14a, 14b and 14c can reduce the number of electric wires. Furthermore, because the FPC 12 can be reduced in size, it is possible to place the switches 14a, 14b and 14c at a desired location such as, for example, on the surface of a dashboard provided in an automotive vehicle.

Figure 3:
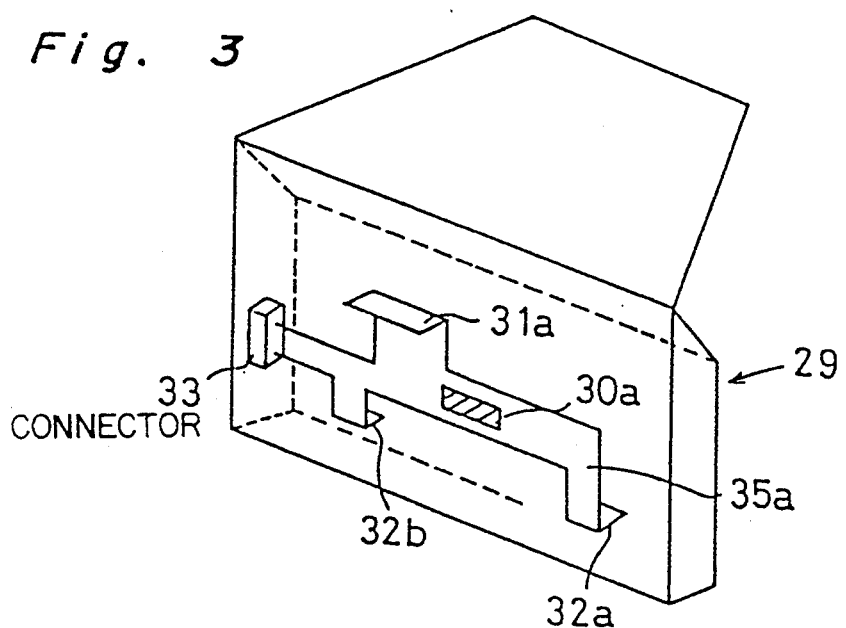
FIG. 3 is a schematic perspective view of a door of an automotive vehicle to which the present invention is applied.

FIG. 3 schematically depicts a door 29 of an automotive vehicle, in which is incorporated an FPC 35a according to the present invention.

On the FPC 35a are provided switches 31a for powered windows, a connector 32a for a door locking motor, a connector 32b for a powered window driving motor, an external communication line connector 33, and a multiplex communication control circuit 30a. The FPC 35a except the switches 31a is accommodated in the door 29. The switches 31a are placed in a passenger compartment for manual operation.

Figure 4:
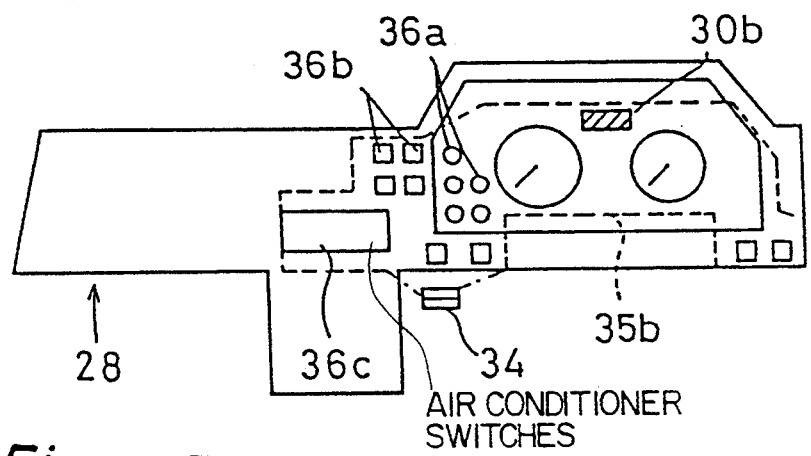
FIG. 4 is a schematic elevational view of a dashboard of an automotive vehicle to which the present invention is applied.

FIG. 4 schematically depicts a dashboard 28 of an automotive vehicle, in which is incorporated an FPC 35b according to the present invention.

On the FPC 35b are provided connectors 36a for warning lamps, computer control switches 36b, air conditioner switches 36c, an external communication line connector 34, and a multiplex communication control circuit 30b. In this case also, because the FPC 35b is flat and flexible, a large space is not required for wiring.

Accordingly, it is possible to accommodate the multiplex communication control circuit 30b inside the dashboard 28.

Figure 5:
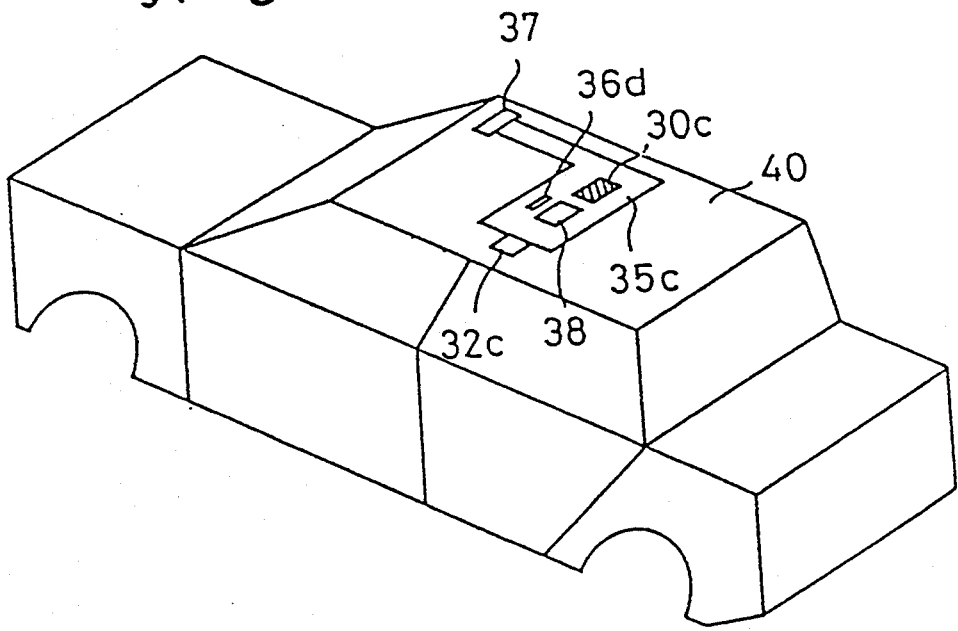
FIG. 5 is a schematic perspective view of an automotive vehicle having a roof to which the present invention is applied.
Figure 7:
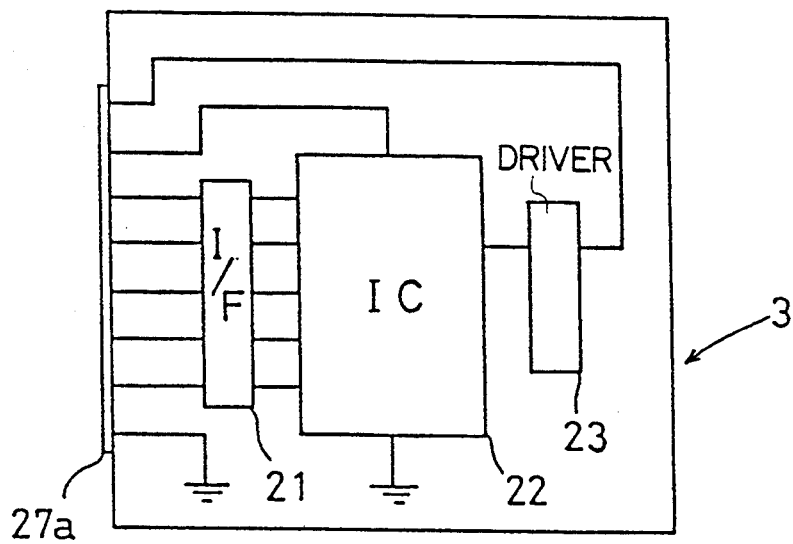
FIG. 7 is a circuit diagram of a multiplex driver unit provided in the multiplex communication system of FIG. 6.
Figure 8:
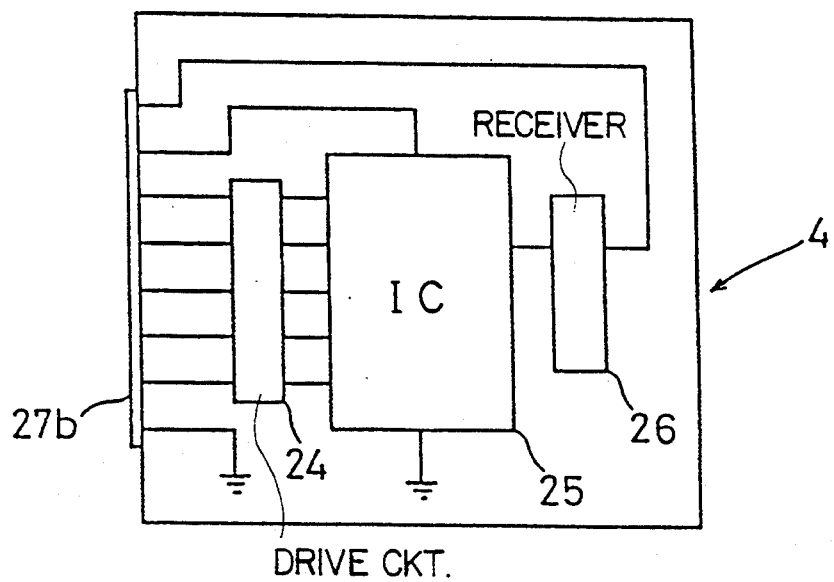
FIG. 8 is a circuit diagram of a multiplex receiver unit provided in the multiplex communication system of FIG. 6.

FIG. 5 schematically depicts a roof 40 of an automotive vehicle, in which is incorporated an FPC 35c according to the present invention.

On the FPC 35c are provided a connector 32c for a sunroof motor, room lamp switches 38, a connector 36d for room lamps, an external communication line connector 37, and a multiplex communication control circuit 30c. In this case also, it is possible to place the multiplex communication control circuit 30c inside the roof 40 and in the proximity of the switches 38.

It is to be noted here that, in the above-described embodiments, although a multiplex communication control circuit and a switch circuit are both formed on a single FPC, the present invention is not limited thereby.

By way of example, a multiplex communication control circuit and a peripheral circuit, for example a switch circuit, may be formed on two different substrates electrically connected with each other via an FPC. In this case also, it is possible to accommodate a communication system in a reduced space, as compared with the conventional system in which a wire harness is employed for wiring. Soldering, connectors or any other suitable means can be used for wiring. The two substrates may be electrically connected with each other by the use of flat cables.

When the FPC is provided with clamps and is fixedly mounted on a vehicle body by the clamps, a void space can be effectively utilized.

As is clear from the above, because a multiplex communication control unit according to the present invention employs a flexible circuit board, a multiplex communication control circuit and a peripheral circuit formed in the proximity thereof can be electrically connected with each other without occupying a large space, thereby reducing a space required for a multiplex communication system.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A multiplex communication control unit for use as an automobile wire harness for electrically connecting a plurality of components disposed in an automotive vehicle, said multiplex communication control unit comprising:

a flexible circuit board;

a multiplex communication control circuit formed on said flexible circuit board and comprising an input interface, a multiplex communication IC and a load control circuit;

plural groups of switches formed on said flexible circuit board in the proximity of said multiplex communication control circuit; and a plurality of load connectors formed on said flexible circuit board;

wherein said flexible circuit board electrically connects said plural groups of switches, said input interface, said multiplex communication IC, said load control circuit, and said plurality of load connectors in this order, thereby to permit accommodation of said multiplex communication control unit in a reduced space within the automotive vehicle.

2. The multiplex communication control unit according to claim 1, wherein said multiplex communication control unit is incorporated in a door of the automotive vehicle.

3. The multiplex communication control unit according to claim 1, wherein said multiplex communication control unit is incorporated in a dashboard of the automotive vehicle.

4. The multiplex communication control unit according to claim 1, wherein said multiplex communication control unit is incorporated in a roof of the automotive vehicle.

* * * * *